United States Patent
Khouri et al.

(10) Patent No.: US 6,650,173 B1
(45) Date of Patent: Nov. 18, 2003

(54) PROGRAMMABLE VOLTAGE GENERATOR

(75) Inventors: Osama Khouri, Milan (IT); Rino Micheloni, Turate (IT); Andrea Sacco, Alessandria (IT); Guido Torelli, Sant'Alessio Con Vialone (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/714,852

(22) Filed: Nov. 15, 2000

(30) Foreign Application Priority Data

Nov. 16, 1999 (IT) .................................. TO99A0994

(51) Int. Cl.⁷ .................................................. G05F 1/10
(52) U.S. Cl. ....................... 327/538; 327/540; 330/86; 330/287
(58) Field of Search ................. 327/538, 540, 327/541, 561, 562; 330/86, 282; 324/316

(56) References Cited

U.S. PATENT DOCUMENTS

| | | | | |
|---|---|---|---|---|
| 4,070,632 A | * | 1/1978 | Tuttle ......................... 330/136 |
| 4,072,906 A | * | 2/1978 | Schroder ..................... 330/86 |
| 5,245,229 A | * | 9/1993 | Colvin, Sr. ................. 327/561 |
| 5,319,345 A | * | 6/1994 | Abe et al. ................... 528/328 |
| 5,387,879 A | * | 2/1995 | Satoh ......................... 330/282 |
| 5,467,052 A | * | 11/1995 | Tsukada ..................... 327/331 |
| 5,523,721 A | * | 6/1996 | Segawa et al. ............. 330/86 |
| 5,694,366 A | * | 12/1997 | Chevallier et al. ......... 365/207 |
| 5,793,249 A | * | 8/1998 | Chen et al. ................. 327/561 |
| 5,852,360 A | * | 12/1998 | Levinson ..................... 323/316 |
| 5,903,504 A | * | 5/1999 | Chevallier et al. ......... 365/207 |
| 5,917,311 A | * | 6/1999 | Brokaw ....................... 323/280 |
| 6,204,789 B1 | * | 3/2001 | Nagata ....................... 341/144 |
| 6,396,934 B1 | * | 5/2002 | Federspiel .................. 381/100 |
| 2001/0019288 A1 | * | 9/2001 | Wada et al. ................. 327/561 |

* cited by examiner

Primary Examiner—Terry D. Cunningham
(74) Attorney, Agent, or Firm—Lisa K. Jorgenson; Harold N. Bennett, II; Seed IP Law Group PLLC

(57) ABSTRACT

The voltage generator comprises a negative feedback loop including a programmable voltage divider having a feedback node. The voltage divider comprises a programmable resistor disposed between the output of the voltage generator and the feedback node and having variable resistance. The programmable resistor includes a fixed resistor and a plurality of additional resistors arranged in series with each other and defining a plurality of intermediate nodes. The additional resistors may be selectively connected by means of switches disposed between the output of the voltage generator and a respective intermediate node so as to define an output voltage $V_O$ programmable on the basis of command signals supplied to the switches.

18 Claims, 3 Drawing Sheets

PROGRAMMABLE VOLTAGE GENERATOR

TECHNICAL FIELD

The invention relates to a programmable voltage generator, particularly for programming multilevel non-volatile memory cells.

BACKGROUND OF THE INVENTION

As is known, a multilevel memory cell, of the flash type for example, may be programmed so as to exhibit one of N threshold voltages (or more precisely one of N distributions of the threshold voltage) and is therefore capable of storing a number $M=\log_2 N$.

The requirements for programming a multilevel memory are much more stringent compared with two level memories: in particular, to obtain an adequate accuracy of the programmed levels it is necessary for the cells to have threshold voltages distributed in intervals which are sufficiently narrow and spaced in a reduced time.

For example, according to a known solution, a stepped voltage which increases linearly with a pre-determined increment is supplied to the selected word line connected to the gate terminal of the cell to be programmed.

This increment must be defined with the utmost accuracy in view of the fact that there is a linear relationship between the increase in the threshold voltage $\Delta V_T$ of the cell to be programmed and the increment of the gate voltage $\Delta V_{GP}$ applied, if the drain voltage of the cell to be programmed is kept constant.

To program four level cells for example it is possible to use a stepped voltage which increases from a minimum value equal to 1.5 V up to a maximum value equal to 9 V, with constant increment equal to approx. 300 mV.

According to a known solution, a voltage generator of the type shown in FIG. 1 is used to obtain the above-mentioned stepped voltage.

In detail, FIG. 1 shows a voltage generator 2 included in a memory device 1 of multilevel type and having an input terminal 2a connected to a reference generator 3, of the band-gap type for example, supplying a reference voltage $V_{BG}$, and an output terminal 2b at which an output voltage $V_O$ is present.

The voltage generator 2 comprises a differential amplifier 4, an operational amplifier for example, having a power supply terminal 4a connected to a power supply line 5 set at a supply voltage $V_{PP}$, a non inverting input 4b connected to the reference generator 3 and an inverting input 4c connected to a feedback node 6. The operational amplifier 4 further has an output terminal coincident with the output terminal 2b of the voltage generator 2.

A voltage divider 9 is connected between the output terminal 2b of the voltage generator 2 and a ground terminal GND and comprises a feedback resistor 8, having a constant resistance $R_1$, and a programmable resistor 10, having a variable resistance $R_2$, as illustrated in detail below. The feedback resistor 8 is connected between the ground terminal GND and the feedback node 6, the programmable resistor 10 is connected between the feedback node 6 and the output terminal 2b.

The voltage generator 2 operates as follows.

During each programming phase of the memory device 1, because of the feedback supplied at the inverting input 4c of the operational amplifier 4, the output voltage $V_O$ depends on the reference voltage $V_{BG}$ and on the resistances $R_1$ and $R_2$ according to the expression:

$$V_0 = V_{BG}\left(1 + \frac{R_2}{R_1}\right) \quad (1)$$

By increasing the resistance of the programmable resistor 10 by a value $R_2^*$, a corresponding increment in the output voltage $V_O$ is obtained, which is equal to:

$$\Delta V_0 = V_{BG}\left(\frac{R_2^*}{R_1}\right) \quad (2)$$

The voltage divider 9 is generally produced as shown in FIG. 2, in which the programmable resistor 10 comprises a fixed resistor 21.0, of resistance $R_0$, and a plurality of additional resistors 21.1, 21.2, ..., 21.n, of resistance R.1, R.2, ..., R.n and disposed in series with each other between the output terminal 2b and the fixed resistor 21.0. For example, the additional resistors 21.1, 21.2, ..., 21.n may be constituted by a string of resistors having a resistance which increases with the powers of two, i.e., for example, if the additional resistor 21.1 has a resistance Rx, the successive additional resistors 21.2, 21.3, ..., 21.n have a resistance of 2Rx, 4Rx, ..., $2^{N-1}$Rx. A selection switch 26.1, 26.2, ..., 26.n, produced as a CMOS switch for example, controlled by a respective command signal, is connected in parallel with each additional resistor 21.1, 21.2, ..., 21.n.

The number of selection switches 26.1, 26.2, ..., 26.n which must be opened or closed from time to time depends on the value of $R_2$ it is desired to program, given that the additional resistors 21.1, 21.2, ..., 21.n which do not contribute to the desired resistance value $R_2$ are each short circuited by a respective selection switch 26.1, 26.2, ..., 26.n.

This known solution does, however, have a number of disadvantages. Primarily the output voltage $V_O$ is not linear.

In fact, although the selection switches 26.1, 26.2, ..., 26.n individually have a small resistance which is negligible compared to the resistances of the respective additional resistors 21.1, 21.2, ..., 21.n, they introduce a resistance error which causes a mismatching between the resistance $R_1$ of the feedback resistor 8 and the resistance $R_2$ of the programmable resistor 10. Furthermore, the resistance error is not constant but depends on the number of closed selection switches 26.1, 26.2, ..., 26.n, and cannot therefore easily be compensated. If a large number of selection switches 26.1, 26.2, ..., 26.n is closed the resistance error becomes substantial and comprises a substantial error on the output voltage $V_O$.

In this connection reference is made to FIG. 3 which shows, as a function of the number n of programming steps, the plot of the ideal voltage $V_{OID}$ (unbroken line) and of the actual voltage $V_{ORE}$ obtained at the output of the voltage generator 2 (dashed line).

The non linearity of the output voltage $V_O$ may be quantified by means of the non linearity error $\epsilon_d$ defined by the expression:

$$\varepsilon_d = \frac{|V_{0ID}(i) - V_{0RE}(i)|}{\Delta V_{GP}}$$

where $V_{OID}$ (i) and $V_{ORE}$ (i) are the ideal and actual values of the output voltage $V_O$ at the i'th programming step and $\Delta V_{GP}$ is the programmed increment of the gate voltage of the cell to be programmed and coincides with $\Delta V_O$.

In practice, the use of the voltage divider 9 of FIG. 2 results in a differential error $\epsilon_d$ on the order of approx. ±15%.

A further disadvantage of this known solution is due to the presence of a voltage spike at the feedback node 6 following the switching of the selection switches 26.1, 26.2, ..., 26.n. This voltage spike, which slows down the rise of the output voltage $V_O$, is due to the injection of charge at the feedback node 6 and its amplitude depends on the number of selection switches which switch contemporaneously with the change in the value to be programmed. Furthermore the injection of charge is particularly high when the selection switches are of large dimensions, as may be demanded by linearity requirements.

On the other hand, to ensure that the output voltage $V_O$ assumes a correct value in a reduced time, as required for programming multilevel cells, it is necessary to reduce the voltage spike at the feedback node 6 to a minimum.

SUMMARY OF THE INVENTION

A voltage generator is provided which drastically reduces the disadvantages described.

The voltage generator comprises a negative feedback loop including a programmable voltage divider having a feedback node. The voltage divider comprises a programmable resistor disposed between the output of the voltage generator and the feedback node and having variable resistance. The programmable resistor includes a fixed resistor and a plurality of additional resistors arranged in series with each other and defining a plurality of intermediate nodes. The additional resistors may be selectively connected by means of switches disposed between the output of the voltage generator and a respective intermediate node so as to define an output voltage $V_O$ programmable on the basis of command signals supplied to the switches.

BRIEF DESCRIPTION OF THE DRAWINGS

For a better understanding of the invention, two embodiments will now be described, purely by way of non-exhaustive example and with reference to the accompanying drawings in which.

DETAILED DESCRIPTION OF THE INVENTION

Figure 1:
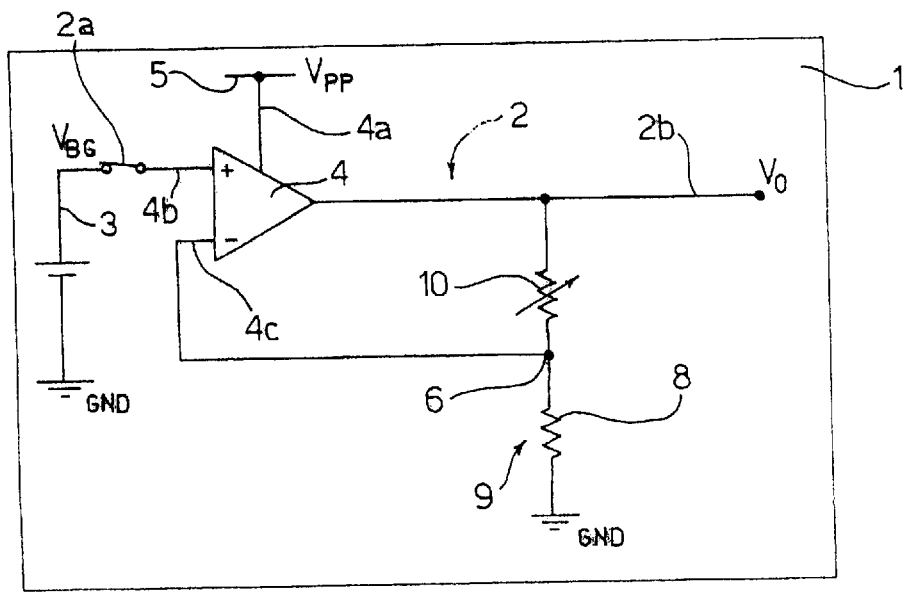
FIG. 1 shows a simplified circuit diagram of a known voltage generator.
Figure 2:
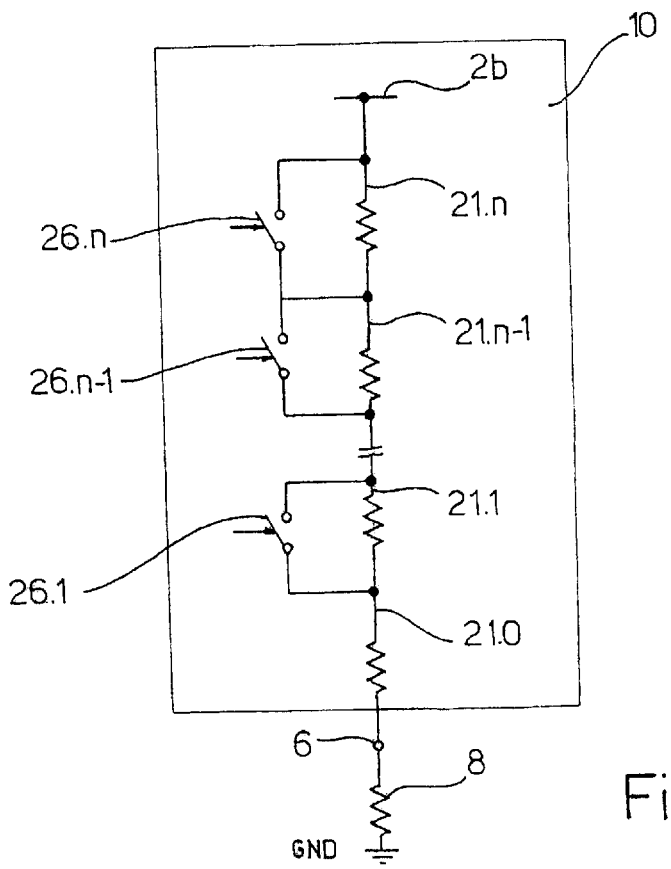
FIG. 2 shows a circuit diagram of a known voltage divider included in the voltage generator of FIG. 1.
Figure 3:
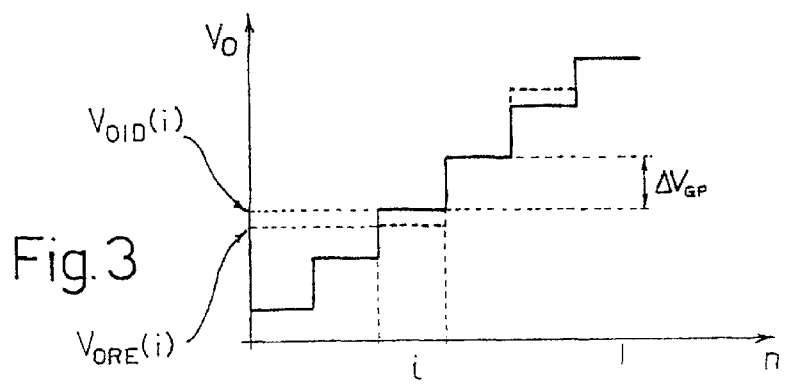
FIG. 3 shows plots of an electrical variable taken at the output of the voltage generator of FIG. 1.
Figure 4:
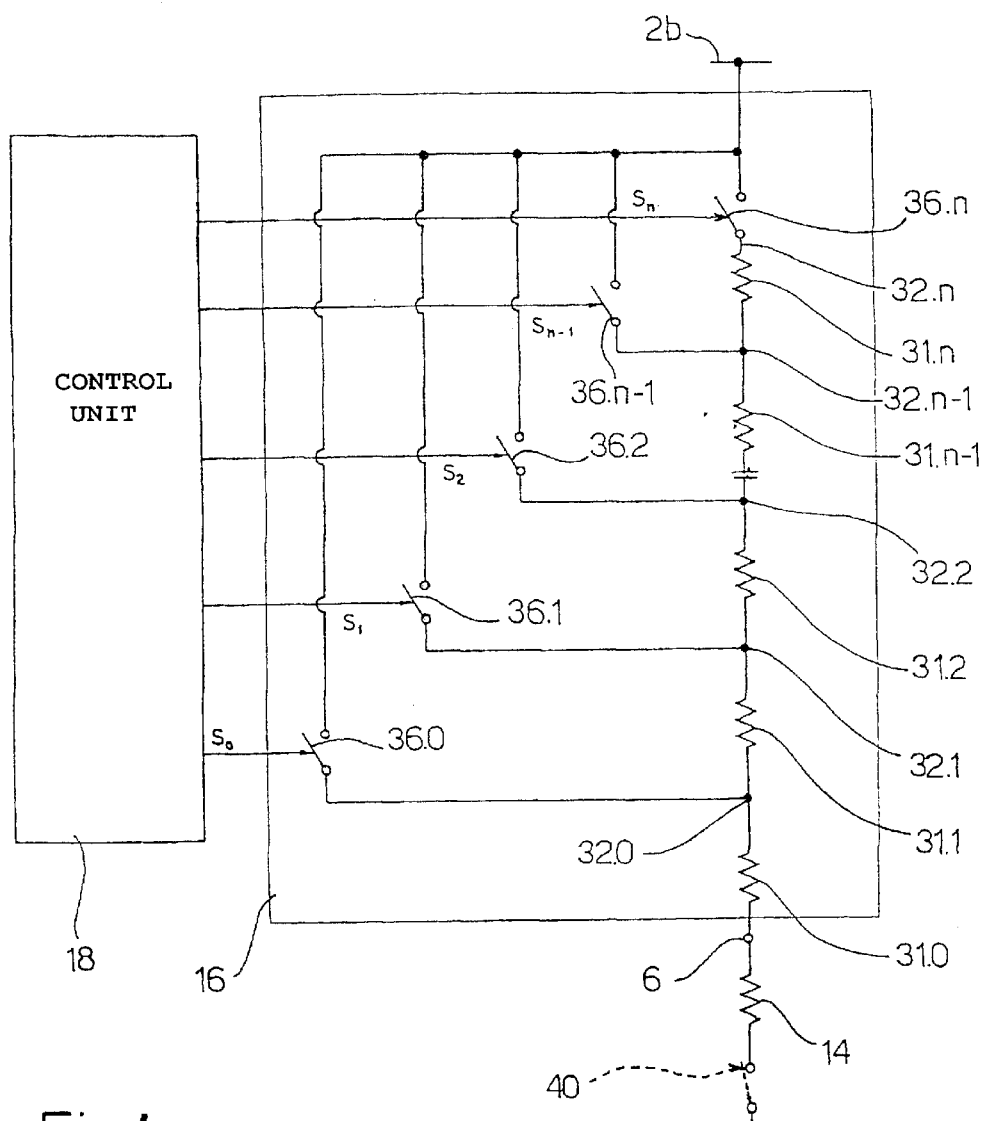
FIG. 4 shows a first circuit embodiment of a voltage divider according to the invention.

FIG. 4 shows a first embodiment according to the invention of the voltage divider 9 of FIG. 1. The voltage divider 9 comprises a feedback resistor 14, having constant resistance $R_1$, and a programmable resistor 16, having variable resistance $R_2$.

The programmable resistor 16 comprises a fixed resistor 31.0, having resistance $R_0$, and a plurality of additional resistors 31.1, 31.2, ... 31.n, having equal resistance $R_E$ and disposed reciprocally in series, between the output terminal 2b and the fixed resistor 31.0.

Intermediate nodes 32.0, 32.1, ..., 32.n−1 connected to the output terminal 2b by means of respective selection switches 36.0, 36.1, ..., 36.n−1 are present between pairs of adjacent resistors 31.0, 31.1, 31.2, ... 31.n; furthermore a selection switch 36.n is interposed between the additional resistor 31.n and the output terminal 2b. Each selection switch 36.0, 36.1, ... 36.n is controlled by a respective closure signal $S_0, S_1, ..., S_n$, where n is equal to the number of additional resistors 31.1, 31.2, ... 31.n which are present. The closure signals $S_0, S_1, ..., S_n$ are generated by a control unit 18 so as to control the closure of one only of the selection switches 36.0, 36.1, ... 36.n at a time, keeping all the other switches open.

When, for example, the selection switch 36.j controlled by the closure signal $S_j$ (j being a number between 0 and n inclusive) is closed, the corresponding intermediate node 32.j is connected directly to the output terminal 2b. Consequently the fixed resistor 31.0 and j additional resistors 31.1, 31.2, ..., 31.j are connected in series between the feedback node 6 and the output terminal 2b while the remaining additional resistors 31.j+1, ..., 31.n are excluded. In this way a single selection switch 36.j, of resistance $r_{on}$, is connected in series with the fixed resistor 31.0 and the j additional resistors 31.1, 31.2, ..., 31.j. Therefore the overall resistance $R_2$ of the programmable resistor 16 is given by the expression:

$$R_2 = R_0 + jR_E + r_{on}$$

and varies between $R_0 + r_{on}$ and $R_0 + nR_E + r_{on}$.

In this way, during each programming phase of the memory device 1 of FIG. 1, because of the feedback supplied to the inverting input of the operational amplifier 4, the output voltage of the voltage generator 2 is given by the expression:

$$V_0 = V_{BG}\left(1 + \frac{R_0 + jR_E + r_{on}}{R_1}\right) \quad (j = 0, 1, \ldots, n)$$

The error on the output voltage $V_O$ due to the resistance $r_{on}$ may be compensated either by reducing the fixed resistance $R_0$ or by disposing a dummy switch 40, always closed, in series with the feedback resistor 14, as shown in FIG. 4 by a dashed line. In particular the resistance $R_{on1}$ of the dummy switch 40 is dimensioned so that the following equation is valid:

$$\frac{R_2 + r_{on}}{R_1 + r_{on1}} = \frac{R_2}{R_1}$$

In this way the values of the resistances $R_2$ and $R_1$ are matched and a minimal non-linearity error (approx. 1%) is guaranteed.

The voltage peaks on the feedback node 6 are also greatly reduced because a single selection switch 36.0, 36.1, ...,36.n is being opened and switched off at all times.

Figure 5:
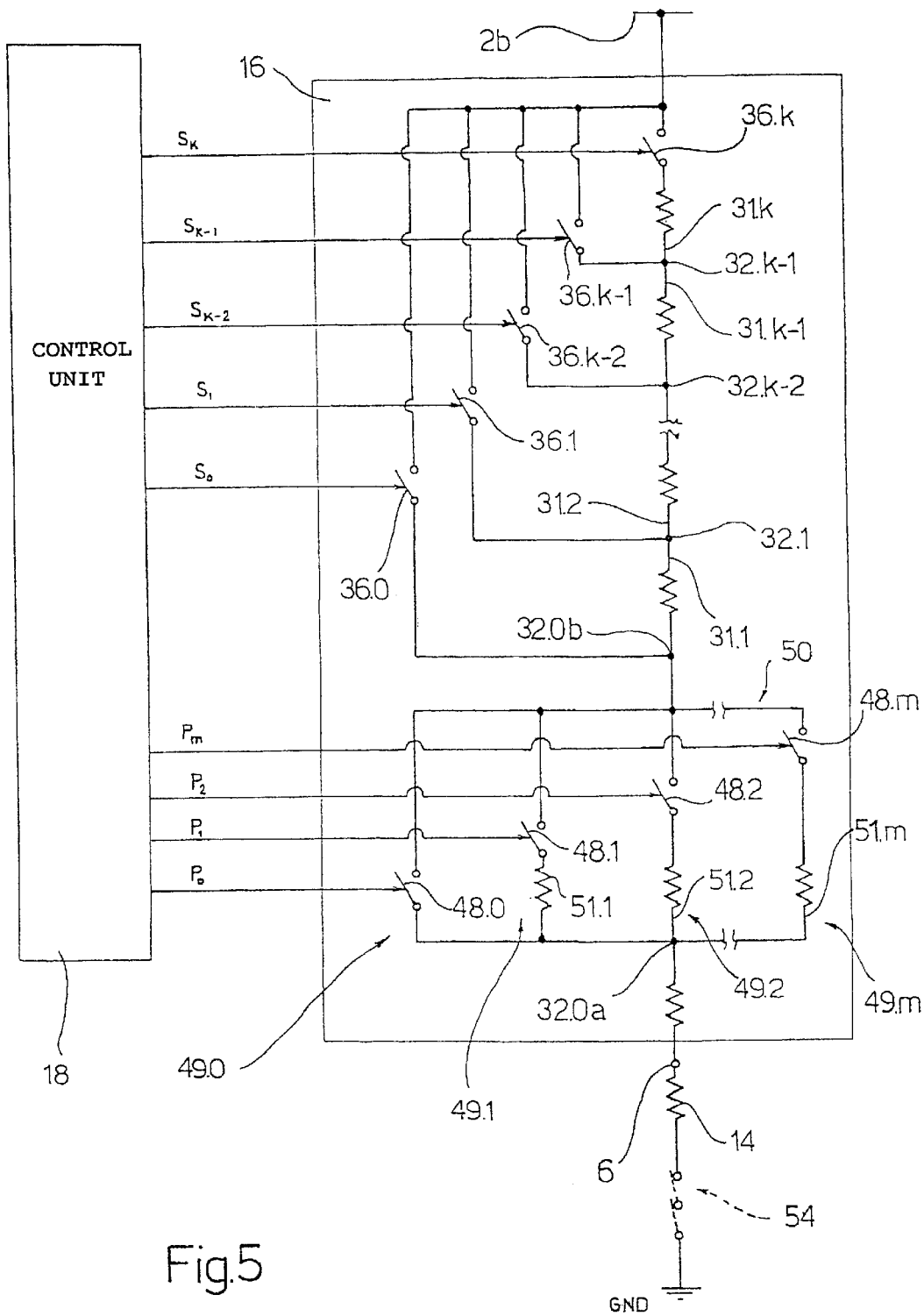
FIG. 5 shows a second circuit embodiment of a voltage divider according to the invention.

FIG. 5 shows a second embodiment of the voltage divider 9 in which k additional resistors 31.1, 31.2, ..., 31.k are present; furthermore the intermediate node 32.0 between the fixed resistor 31.0 and the first additional resistor 31.1 is divided into two nodes 32.0a and 32.0b and a circuit network 50 is present between the nodes 32.0a and 32.0b.

The circuit network 50 comprises a plurality of branches 49.0, 49.1, ..., 49.m connected reciprocally in parallel between the nodes 32.0a and 32.0b. The branch 49.0 comprises a parallel switch 48.0 only. The branches 49.1, 49.2, ..., 49.m each comprise a parallel resistor 51.1, 51.2, ..., 51.m and a parallel switch 48.1, 48.2, ..., 48.m, reciprocally in series. The parallel resistors 51.1, 51.2, ..., 51.m have multiple resistance $R_{Ei}$ with respect to a resistance $R_{EP}$ equal to the sum of the resistances of the additional resistors 31.1, ..., 31.k, i.e., $R_{EP}=kR_E$. Consequently the parallel resistor 51.1 has a resistance equal to $R_{EP}$, the parallel resistor 51.2 has a resistance equal to $2R_{EP}$, ... and the parallel resistor 51.m has a resistance equal to $mR_{EP}$.

Each parallel switch 48.0, 48.1, 48.2, ..., 48.m is controlled by a respective closure signal $P_0$, $P_1$, ..., $P_m$, where m is equal to the number of parallel resistors 51.1, 51.2, ... 51.m which are present and has a resistance $r_{on}$ equal to the resistance of the selection switches 36.0, 36.1, ..., 36.k.

The closure signals $P_0$, $P_1$, $P_m$ are generated by the same control unit 18 which generates the closure signals $S_0$, $S_1$, ..., $S_k$. In particular, the control unit 18 causes the closure of a single selection switch 36.0, 36.1, ..., 36.k and of a single parallel switch 48.0, 48.1, 48.2, ..., 48.m to obtain the desired resistance value $R_2$.

In the circuit of FIG. 5 the overall resistance values $R_2$ of the programmable resistor 16 can be found by the expression:

$$R_2 = R_0 + \sum_{i=0}^{m} \sum_{j=0}^{k} (jR_E + iR_{EP})$$

and the overall number of obtainable resistor values is equal to (m+1)k+1=n.

Because a single selection switch 36.0, 36.1, ..., 36.k and a single parallel switch 48.0, 48.1, 48.2, ..., 48.m are closed at the same time and they have equal resistance, as noted above, the contribution which the switches 36.0, 36.1, ..., 36.k, 48.0, 48.1, 48.2, ..., 48.m make to the value of the overall resistance $R_2$ is given by $2r_{on}$.

Therefore, in a similar manner to the description for the embodiment of FIG. 4, in order to obtain an adequate match between the overall resistance of the feedback resistor 14 and the resistance of the programmable resistor 16 and hence guarantee a minimum non-linearity error$_{-d}$, two dummy switches 54 each having a resistance $R_{on1}$ of value such that:

$$\frac{R_2 + 2r_{on}}{R_1 + 2r_{on1}} = \frac{R_2}{R_1}$$

in which $r_{on}$ represents the resistance of the switches 36.0, 36.1, ..., 36.k, 48.0, 48.1, 48.2, ..., 48.m in this case also, are connected in series to the feedback resistor 14.

Compared to the first embodiment of the programmable resistor 16 this second embodiment has the further advantage of reducing the overall number of selection switches and of relative control lines, thereby reducing the dimensions of the memory device 1.

Finally it will be evident that modifications and variants may be introduced to the voltage generator described without thereby departing from the scope of the invention.

For example, in the second embodiment of the voltage divider 9 the plurality of parallel resistors 51.1, 51.2, ..., 51.m may be inserted between the plurality of additional resistors 31.1, 31.2, ..., 31.k and the output terminal 2b of the voltage generator 2 instead of in the position shown.

Furthermore, although the description of the present generator refers to use as a stepped voltage generator for programming multilevel memory cells it may be employed in a plurality of applications, such as in a digital/analogue converter, and generally wherever a stable and accurate programmable voltage is required to be available.

What is claimed is:

1. Programmable voltage generator comprising:

a negative feedback element;

a programmable resistive divider; and control means, said feedback element having a first and a second input terminal, and an output terminal coupled to an output node, said first input terminal receiving a reference quantity, said programmable resistive divider having a feedback node connected to said second input terminal and comprising a feedback resistor interposed between a line at reference potential and said feedback node and a programmable resistor interposed between said feedback node and said output node, said programmable resistor comprising a plurality of resistive elements and a plurality of controlled switch elements, said resistive elements disposed reciprocally in series between said output node and said feedback node and defining between them a plurality of intermediate nodes; each of said controlled switch elements directly connected between said output node and a respective intermediate node, said programmable resistive divider further comprising an additional controlled switch element interposed between the output terminal and a first one of the plurality of resistive elements, and said control means suitable for varying a total resistance between the output node and the line at reference potential by selectively controlling the closure of one of said controlled switch elements.

2. Voltage generator according to claim 1, wherein said controlled switch elements each comprise a control terminal receiving a respective control signal; said control signals being switchable between a first value suitable for controlling the closure of a respective controlled switch element and a second value suitable for controlling the opening of a respective controlled switch element; at any time, one only of said control signals having said first value.

3. Voltage generator according to claim 1, wherein said programmable resistive divider comprises a fixed resistor interposed between one of said resistive elements and said feedback node, each of said resistive elements and said fixed resistor having equal resistance.

4. Voltage generator according to claim 1, wherein said generator comprises a dummy switch disposed in series with said feedback resistor.

5. Voltage generator according to claim 1, wherein said programmable resistive divider further comprises a circuit network disposed between said feedback node and one of said resistive elements, said circuit network comprising a plurality of branches connected together in parallel and each including a parallel resistor and a parallel switch which are disposed in series with each other.

6. Voltage generator according to claim 5, wherein said circuit network further comprises a single parallel switch disposed in parallel with said plurality of branches.

7. Voltage generator according to claim 6, wherein said resistive elements have overall a first resistance value, and in that said parallel resistors have second resistance values which are multiples of said first resistance value according to an arithmetical progression.

8. Voltage generator according to claim 7, wherein said generator comprises two dummy switches disposed in series with said feedback resistor.

9. Programmable voltage generator comprising:
a differential amplifier having a positive input terminal, a negative input terminal and an output terminal;
a reference voltage, tied to said positive input;
a feedback node tied to said negative input terminal;
a feedback resistor tied at one end to said feedback node and tied at the other end to a common ground;
a programmable resistive element tied at one end to said feedback node and tied at the other end to said output terminal;
a control means;
said programmable resistive element comprising:
a plurality of resistors linked in series, a resistor node between each adjacent pair of resistors;
said series of resistors tied at one end to said feedback node, and at the other end to the output terminal;
a plurality of switches, each switch directly connected at a first conduction terminal to said output terminal and at a second conduction terminal to an individual one of said resistor nodes;
said plurality of switches controlled by said control means, such that switches not selected by said control means remain open, while a selected switch closes a circuit between it's respective resistor node and said output terminal; and
an additional switch interposed between the output terminal and a first one of the plurality of resistors, the additional switch being controlled by the control means as one of the plurality of switches said control means configured to vary a total resistance between the output terminal and the common ground by selectively closing one of the plurality of switches.

10. The voltage generator according to claim 9, wherein each of said plurality of resistors has the same resistive value.

11. The voltage generator according to claim 9, wherein each of said plurality of switches has the same resistive value.

12. The voltage generator according to claim 11, wherein one of said plurality of resistors is tied to said feedback terminal, and is of a resistive value such that the sum of the resistive value of said resistor plus the resistive value of one of said plurality of switches is equal to the resistive value of any one of the remainder of said plurality of resistors.

13. The voltage generator according to claim 11 further comprising a dummy switch, in series with said feedback resistor, of a resistive value to compensate for the resistive value of one of said plurality of switches.

14. The voltage generator according to claim 9 including a second programmable resistive element arranged in series with the plurality of resistors of said programmable resistive element, the second programmable resistive element comprising:
a plurality of circuits arranged in parallel;
a first of said plurality of circuits comprising a switch;
a second of said plurality of circuits comprising a switch and a resistor of a resistive value equal to the sum of resistive values of said plurality of resistors;
the remaining individuals of said plurality of circuits wherein each successive one of said plurality of circuits comprises a switch and a resistor of a value equal to twice the resistive value of the resistor of the preceding one of said plurality of circuits; and
wherein the second programmable resistive element is controlled by the control means.

15. The voltage generator according to claim 14, wherein such switches controlled by said control means includes said plurality of switches and the switches of said plurality of circuits, such that switches not selected by said control means remain open, while a selected switch closes; said control means being limited to prevent the selection of more than one each of said plurality of switches and one switch of said plurality of circuits simultaneously.

16. Programmable voltage generator comprising:
a negative feedback element;
a programmable resistive divider;
control means,
said feedback element having a first and a second input terminal, and an output terminal, said first input terminal receiving a reference quantity,
said programmable resistive divider having a feedback node connected to said second input terminal and comprising a feedback resistor interposed between a line at reference potential and said feedback node and a programmable resistor interposed between said feedback node and said output terminal,
said programmable resistor comprising a plurality of resistive elements and a plurality of controlled switch elements, said resistive elements disposed reciprocally in series between said output terminal and said feedback node and defining between them a plurality of intermediate nodes; said controlled switch elements interposed between said output terminal and a respective intermediate node,
said control means suitable for selectively controlling the closure of said controlled switch elements; and
a dummy switch disposed in series with said feedback resistor.

17. Programmable voltage generator comprising:
a differential amplifier having a positive input terminal, a negative input terminal and an output terminal;
a reference voltage, tied to said positive input;
a feedback node tied to said negative input terminal;
a feedback resistor tied at one end to said feedback node and tied at the other end to a common ground;
a programmable resistive element tied at one end to said feedback node and tied at the other end to said output terminal;
a control means;
said programmable resistive element comprising:
a plurality of resistors linked in series, a resistor node between each adjacent pair of resistors;
said series of resistors tied at one end to said feedback node, and at the other end to the output terminal;
a plurality of switches, each switch directly connected at a first conduction terminal to said output terminal and at a second conduction terminal to an individual one of said resistor nodes;
said plurality of switches controlled by said control means, such that switches not selected by said control means remain open, while a selected switch closes a circuit between it's respective resistor node and said output terminal; said control means configured to vary a total resistance between the output terminal and the common ground by selectively closing one of the plurality of switches wherein each of said plurality of switches has the same resistive value; and a dummy switch, in series with said feedback resistor, of a resistive value to compensate for the resistive value of one of said plurality of switches.

18. A Programmable voltage generator comprising:

a negative feedback element;

a programmable resistive divider; and control means, said feedback element having a first and a second input terminal, and an output terminal coupled to an output node, said first input terminal receiving a reference quantity, said programmable resistive divider having a feedback node connected to said second input terminal and comprising a feedback resistor interposed between a line at reference potential and said feedback node and a programmable resistor interposed between said feedback node and said output node, said programmable resistor comprising a plurality of resistive elements and a plurality of controlled switch elements, said resistive elements disposed reciprocally in series between said output node and said feedback node and defining between them a plurality of intermediate nodes; each of said controlled switch elements directly connected between said output node and a respective intermediate node, said programmable resistive divider further comprising a circuit network disposed between said feedback node and one of said resistive elements, said circuit network comprising a plurality of branches connected together in parallel, each branch including a parallel resistor and a parallel switch which are disposed in series with each other, and said control means suitable for varying a total resistance between the output node and the line at reference potential by selectively controlling the closure of one of said controlled switch elements.

* * * * *